US006811726B1

(12) United States Patent
Sanchez

(10) Patent No.: US 6,811,726 B1
(45) Date of Patent: Nov. 2, 2004

(54) ONE DIMENSIONAL CERAMIC CONDUCTIVE OXIDES

(76) Inventor: Moises G. Sanchez, 480 Severnside Dr., Severna Park, MD (US) 21146

( * ) Notice: Subject to any disclaimer, the term of this patent is extended or adjusted under 35 U.S.C. 154(b) by 0 days.

(21) Appl. No.: 10/435,383

(22) Filed: May 12, 2003

Related U.S. Application Data

(60) Provisional application No. 60/441,129, filed on Jan. 21, 2003, and provisional application No. 60/378,077, filed on May 16, 2002.

(51) Int. Cl.$^7$ ................................................. H01B 1/08
(52) U.S. Cl. ..................... 252/521.2; 501/123; 117/947
(58) Field of Search ............................... 505/100, 776; 252/521.2; 501/123; 117/947

(56) References Cited

PUBLICATIONS

Pyatnitskii et al (Kinetics of nonstationary condensation of methane on a perovskite catalyst), Theoretical and Experimental Chemistry (2000), 36(3), 168–172 (Abstract Only).*
Il'chenko et al (Influence of the composition of Co–containing perovskites on their catalytic properties in the conversion of methane into higher hydrocarbons in non–stationary conditions) Theoretical and Experimental Chemistry (2000), 36(1), 48–53 (Ab).*
Pyatnitsky (Methane coupling over SrCoO3–based perovskites in the absence of gas–phase oxygen) Studies in the Surface Science and Catalysis (2000), Pt. A, 707–712 (Abstract Only).*
XRD Card No. 70–0363. International Centre for Diffraction Data (1976).
XRD Card No. 25–904. International Centre for Diffraction Data (1972).
A. F. Wells "Structural Inorganic Chemistry" Third Edition p. 494–496. Oxford University Press 1962.
C.–J. Liu et al. Chemistry of Materials vol. 3, No. 3, 495–500 (1991).

J.M. Tarascon et al. "Superconductivity at 40 K in the Oxygen–Defect Perovskites La2–x Srx Cu O4–y" Science 1987 vol. 235 p. 1373.
XIII Winter Meeting on Low Temperature Physics (Jan. 19/22, 1992) Abstract of talk by M.G. Sanchez on Cuprates, Nickelates and Nickelo–cuprates.
T. Yamanaka et al. American Mineralogist, vol. 87 p. 1183, (2002).
K. Takeda et al. Nature 422: 53–55 (Mar. 6, 2003).
H. Kamerlingh Onnes. "The discovery of Superconductivity" Commun. Phys. Lab. 12, 120 (1911).
A.W. Sleight et al. "High–temperature superconductivity in the BaPb1–xBixO3 systems" Solid State Communications, vol. 17, Issue 1, Jul. 1975, pp. 27–28.
J.G. Bendorz, K.A. Muller, "Possible high–Tc superconductivity in the Ba–La–Cu–O system" Zeitschrift für Physik B–Condensed Matter, 64 (2), 189–93, Sep. 1986.

(List continued on next page.)

Primary Examiner—Mark Kopec
(74) Attorney, Agent, or Firm—Edward J. Cabic

(57) ABSTRACT

This application describes ceramic oxide superconductors, their precursors and methods of preparation. The superconductors contain no copper, but comprise the transition metals Nickel or Cobalt ($M^T$) together with bulky cations of Groups 2 and 1 of the Periodic Table ($M^{2+}$ and $M^{1+}$) such as $Ba^{2+}$ and $K^{1+}$. Their hexagonal crystal structure comprises parallel chains of highly covalent, octahedrally coordinated oxygen around the transition metal, which exhibits its highest valence +4. The octahedra are facet-linked forming polyacid chains or macroanions that run the full length of crystallites or single crystals along the c axis. The chains are separated by distances that prevent covalency or orbital overlap among them. They are held together by coulombic forces from the cations located between them that also run parallel to the c axis. Electrical current, carried by holes, can only flow within the chains. Thus the materials are one-dimensional superconductors of composition $M^{2+}_{(1-x)}M^{1+}_{x}M^{T}O_{3-\delta}$.

21 Claims, 4 Drawing Sheets

OTHER PUBLICATIONS

"Superconductivity above 90 K in the square–planar compound system A Ba2 Cu3 O6+x with A=Y, La, Nd, Sm, Eu, Gd, Ho, Er and Lu" Phys. Rev. Lett. 58, 1891–1894 P.H. Hor et al.

J.J. Lander. "The Phase BaO–NiO" J. Amer. Chem. Soc. 1951 vol. 73 p. 2450.

J.J. Lander et al. "Barium–Nickel Oxides with Tri–and Tetravalent Nickel". J. Amer. Chem. Soc. 1951 vol. 73 p. 2452.

J.J. Lander "The crystal Structure of NiO.3BaO, NiO.BaO, BaNiO3 and Intermediate. Phase . . ." Acta Cryst. 1951 vol. 4 p. 148.

Y. Takeda et al. "The Crystal Structure of BaNiO3" Acta Cryst. (1976) B32, 2464.

XRD Card No. 29–196. International Centre for Diffraction Data (1976).

* cited by examiner

FIGURE 1
MACROANIONS IN THE HEXAGONAL CRYSTAL STRUCTURE OF BaNIO₃

Figure 1a
Truncated Macroanion shown parallel to the c₀ axis

Figure 1b
Truncated Macroanion and neutralizing cations

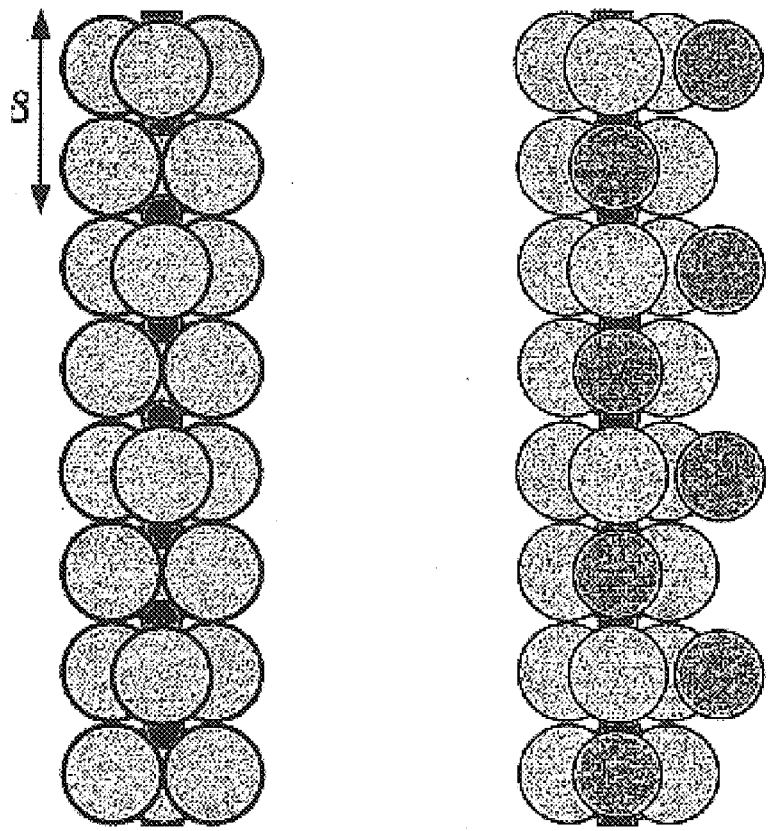

ELEMENTS & APPROXIMATE SIZES

| Barium | Nickel | Oxygen |
|---|---|---|
|  |  | 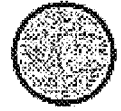 |

Figure 1a. Representation of a truncated macroanion consisting of covalently bonded [Ni–O$_{6/2}$] octahedra with linked facets.
Figure 1b. The macroanion with neutralizing barium cations.

FIGURE 2
HEXAGONAL STRUCTURE OF BaNiO₃
Five Sections Viewed at Regular Intervals along the c Axis
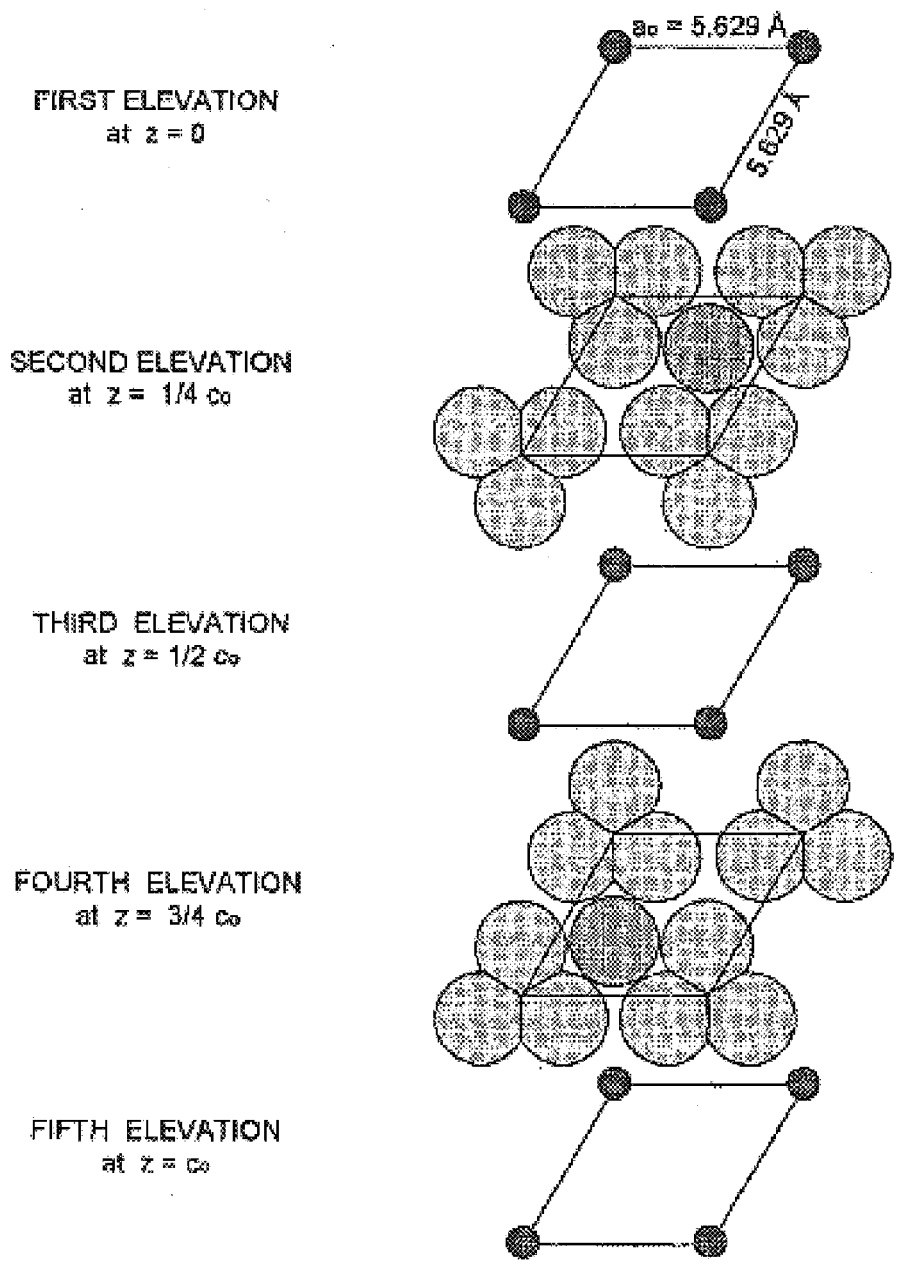
FIRST ELEVATION at $z = 0$
SECOND ELEVATION at $z = 1/4\, c_0$
THIRD ELEVATION at $z = 1/2\, c_0$
FOURTH ELEVATION at $z = 3/4\, c_0$
FIFTH ELEVATION at $z = c_0$
ELEMENTS and RADII (Å)
  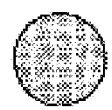
BARIUM ~1.35 Å    NICKEL ~0.5 Å    OXYGEN ~1.40 Å

FIGURE 3

TABLE III

| Miller Indices | | | BaNiO$_3$ | | BaCoO$_3$ | | SrNiO$_3$ | |
|---|---|---|---|---|---|---|---|---|
| | | | XRD Card* No. 29-196 | | No. 70-0363 | | No. 25-904 | |
| | | | Authors: Takeda et al (1976) | | Taguchi et al (1977) | | Takeda et al (1972) | |
| | | | System: Hexagonal | | Hexagonal | | Hexagonal | |
| | | | Unit Cell Edges (Å): a$_o$ = 5.629 | | a$_o$ = 5.645 | | a$_o$ = 5.355 | |
| | | | c$_o$ = 4.811 | | c$_o$ = 4.752 | | c$_o$ = 4.860 | |
| | | | Vol. (Å)$^3$: V=132.02 | | V=131.14 | | V=120.69 | |
| h | k | l | d (Å) | Intens. | d (Å) | Intens. | d (Å) | Intens. |
| 1 | 0 | 0 | 4.875 | 4 | 4.889 | 1 | 4.640 | 20 |
| 1 | 0 | 1 | 3.424 | 100 | 3.407 | 100 | 3.360 | 100 |
| 1 | 1 | 0 | 2.814 | 84 | 2.823 | 82 | 2.680 | 100 |
| 0 | 0 | 2 | 2.405 | 6 | 2.376 | 8 | 2.430 | 4 |
| 2 | 0 | 1 | 2.174 | 50 | 2.174 | 55 | 2.093 | 80 |
| 1 | 0 | 2 | 2.157 | 29 | 2.137 | 26 | 2.154 | 15 |
| 1 | 1 | 2 | 1.828 | 3 | 1.818 | 5 | 1.800 | 6 |
| 2 | 1 | 1 | 1.720 | 17 | 1.722 | 19 | 1.646 | 30 |
| 2 | 0 | 2 | 1.712 | 20 | 1.704 | 19 | 1.678 | 7 |
| 3 | 0 | 0 | 1.624 | 11 | 1.630 | 12 | 1.546 | 20 |
| 1 | 0 | 3 | 1.523 | 5 | 1.507 | 6 | 1.530 | 15 |

* Identification Card Number from the International Centre for Diffraction Data (ICDD).

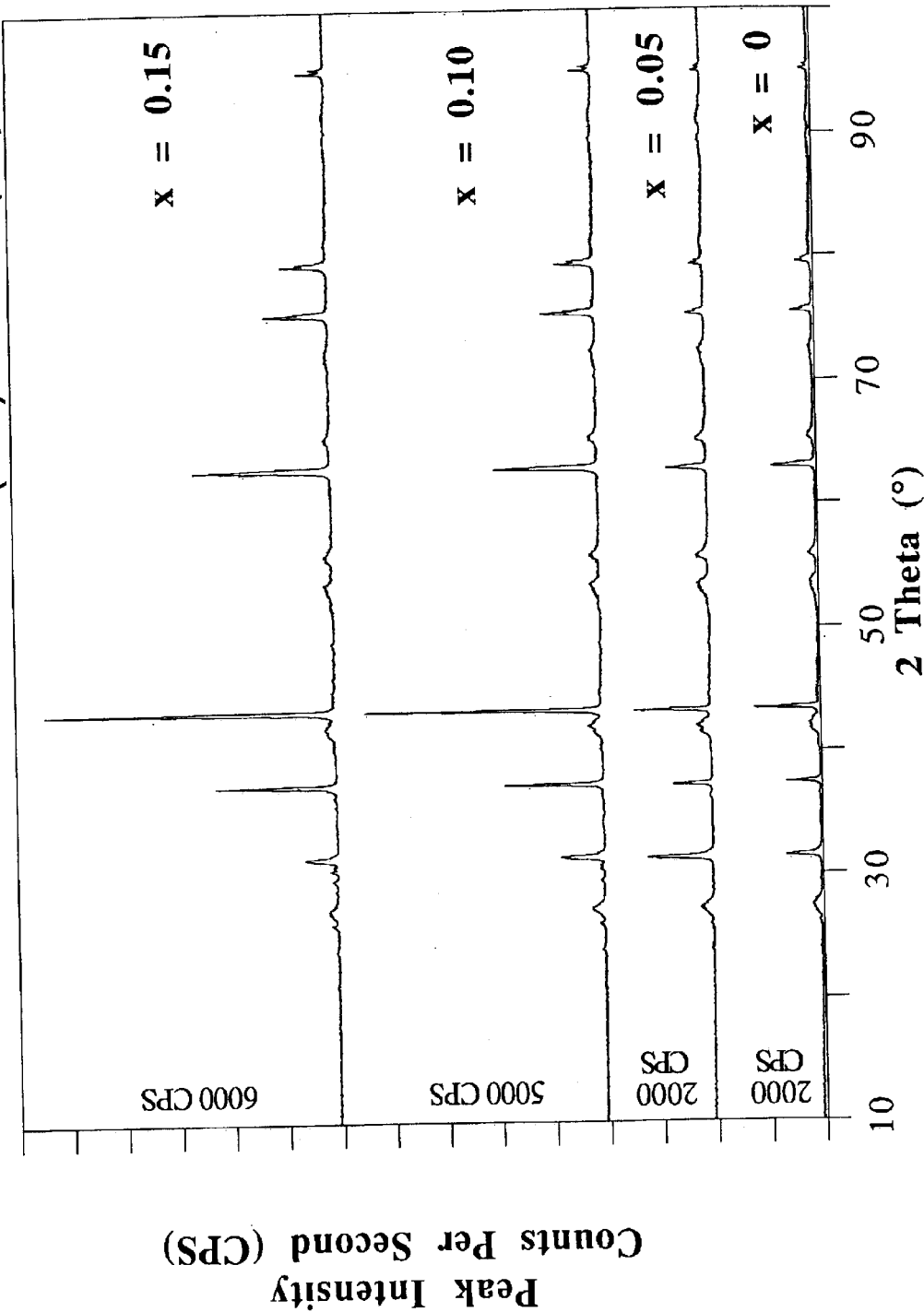

ONE DIMENSIONAL CERAMIC CONDUCTIVE OXIDES

REFERENCE TO RELATED APPLICATIONS

This application claims the benefit of U.S. provisional applications No. 60/441,129, filed Jan. 21, 2003, and No. 60/378,077, filed May 16, 2002, the entire contents of which are incorporated herein by reference.

BACKGROUND OF THE INVENTION

1. Field of the Invention

This invention relates to high critical temperature, ceramic, oxide superconductors comprising one transition metal, one metal of Group 2 of the Periodic Table and one metal of Group 1 of the Periodic Table. A key distinctive feature of the products of this invention is the hexagonal crystal symmetry of their structure that comprises highly covalent oxide chains containing the transition metal. The chains are parallel to the c axis. More specifically the superconductors of this invention comprise the transition metals nickel or cobalt. They may be prepared in powder form, in polycrystalline compacts, in dense polycrystalline aggregates and in single crystals.

The invention also relates to processes to prepare the superconductors in each of the above mentioned forms.

In another specific embodiment the invention relates to precursors of the superconductors and their preparation.

Superconductors are useful materials that find applications in magnetic, electric and electronic applications such as high flux electromagnets, magnetic instrumentation, transmission lines, levitation phenomena, storage of electrical energy, etc.

2 Description of the Previously Published Art 2.1 High Critical Temperature Ceramic Oxide Superconductors.

Superconductivity is the property of materials that exhibit zero electrical resistance when cooled to or below a temperature called the critical temperature ($T_c$). It was discovered by H. Kamerlingh Onnes in 1911 using the extremely low temperature of liquid helium. For many decades superconductivity remained a laboratory curiosity with no extensive practical applications because of the very low temperatures required to achieve it in metals, metallic alloys and binary metallic compounds.

In the 1970's superconductivity was observed in perovskite metal oxides structures. By 1975 A. W. Sleight and coworkers found that in $BaPbO_3$ (barium plumbate) which is a perovskite-type oxide, 5 to 30% substitution of Bi for Pb induces superconductivity. These findings did not receive much attention from the scientific community possibly because of their low $T_c$.

In 1986 a major breakthrough was achieved by T. G. Bednorz and K. A. Müller (Z. Phys. 1986, B64, 189) with the discovery of a complex ceramic oxide that becomes a superconductor at about 30 K. The material was a complex oxide of lanthanum, barium and copper, with perovskite-related symmetry (tetragonal with space group I4/mmm) and having a composition of

$La_{1.85}Ba_{0.15}CuO_4$  Formula 1

This impressive result was immediately followed up by much research throughout the world, and by 1987 the isostructural superconductor $La_{1.85}Sr_{0.15}CuO_4$ with a $T_c$ of about 37 K was prepared by J. M. Tarascon et al. (Science, 1987, 235, 1373). Also that year C. W. Chu et al (Phys. Rev. Lett. 58, 1891–1894 (1987)) prepared the superconductor $YBa_2Cu_3O_7$ (called 1-2-3 because of the atomic ratios of the metals) with a $T_c$ of about 93 K, which is higher than the boiling point of liquid nitrogen. This development was both a major scientific and a technological breakthrough because superconductivity was achieved for the first time using a practical and readily available coolant that opened a wide field of applications.

During the last 15 years, scientists have made many variations of, and advances over the original material, with increases in $T_c$ to about 128 K ($Tl_2Ca_2Ba_2Cu_3O_{10}$).

In order to clearly describe materials and avoid confusion, the specific meaning of certain terms used in this application, will be defined next.

The term "parent" is used to refer to oxide compounds consisting chemically of a transition metal oxide and an ionic metal oxide such as for example $La_2CuO_4$.

The term "main cation" refers to the ionic metal cation in the parent material such as for example $La^{3+}$.

The term "doping" and related terms such as "dopant", "doped", etc., refer to the replacement in the crystal structure, on a one for one atomic basis, of part of the main cation, by cations of different but fix valence for example $Ba^{2+}$ in $La_{1.85}Ba_{0.15}CuO_4$.

The new material discovered by Bednorz and Müller lead to the new superconductor class referred to as high-$T_c$ ceramic, oxide superconductors. The series of complex oxides prepared in their work may be visualized as descendants from the parent oxide lanthanum cuprate ($La_2CuO_4$) after doping with barium. The series may be represented by the variable formula:

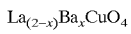

$La_{(2-x)}Ba_xCuO_4$  Formula 2 in which x ranges from about 0.05 to about 0.25. In this range the doping, either with Ba or Sr does not affect the tetragonal symmetry (space group I4/mmm) of the parent lanthanum cuprate, although it slightly changes the unit cell dimensions. The most significant discovery was that starting in the range of about x=0.05 to about x=0.10 the doped materials became low $T_c$ superconductors. As x increased so did $T_c$ up to x=0.15. At this point the $T_c$ became about 30 K. Beyond x=0.15 the materials, while remaining superconductors, decreased in $T_c$.

Detailed studies of the crystal structure revealed that all the superconductors of the barium series, as well as the isostructural members of the strontium series consist of alternating charged layers of opposite sign. One type of layer is a covalent square planar array with a composition of $[CuO_{4/2}]$ or $[CuO_2]$ located next to parallel ionic layers with a composition of $[La_{(2-x)}Ba_xO_2]$. The average charge density of the ionic layer is readily calculable from the composition and valence of its constituent ions. It is +(2−x) per $[La_{(2-x)}Ba_xO_2]$. For the $[CuO_2]$ covalent layer the average charge density must become −(2−x) in order to maintain overall crystal neutrality.

It is interesting to note that the charge density of the $[CuO_2]$ covalent layer goes from −2 for the parent material $La_2CuO_4$ to −(2−x) for any of the doped members of the series and that the $[CuO_2]$ layer undergoes oxidation as x increases. In this progression the parent material undergoes a transition from insulator to superconductors. The resulting $T_c$'s are in some unknown manner a function of the degree of oxidation of the covalent $[CuO_2]$ plane.

Work to better understand these observations lead to some fundamental questions regarding the oxidation of the $[CuO_2]$ layers.

Does it result in the oxidation of $Cu^{2+}$ to $Cu^{3+}$ or in the oxidation of $O^{2-}$ to $O^{1-}$ to form electron holes?

Is it possible that both elements undergo oxidation and that there exist an equilibrium between the four possible valences? ($Cu^{2+}$, $Cu^{3+}$, $O^{2-}$ and $O^{1-}$).

In the latter case, which one is the predominant oxidized element, $Cu^{3+}$ or $O^{1-}$?

This matter was studied using Hall effect measurements and other techniques that showed that the great majority of the electrical carriers are $O^{1-}$ holes.

Regarding electrical conductivity, the present accepted view is that the holes move in the two-dimensional [$CuO_2$] layers.

These data are in sharp contrast with the behavior of earlier metallic superconductors in which electrons carried the current in three, not two dimensions.

On another matter, the negative results of hundreds of studies done all over the world over the last 15 years or so using transition metals other than copper lead to the empirical "inference" that only ceramic materials comprising copper oxide yield high $T_c$ superconductors.

Another interesting point worth noting on the work of the last 15 years or so is that during that period no high-$T_c$, "one-dimensional" ceramic oxide superconductor has been reported.

From a theoretical point of view, the fundamental reasons for the cuprates to become high-$T_c$ superconductors are not as yet fully understood. The BCS (Bardeen, Cooper and Schrieffer) theory, which accounts for superconductivity in metals, metal alloys and binary metal compounds in three dimensions does not account for the high-$T_c$ superconductors based on [$CuO_2$] that conduct electricity in only two dimensions.

2.2. The Ceramic Barium Oxide-Nickel Oxide System

The following is a brief review of the work on the ceramic BaO—NiO system for materials with a Ba to Ni atomic ratio of 1.

None of the prior art involves superconductors.

The significant references follow.

The Phase System BaO—NiO. J. J. Lander (J. Amer. Chem. Soc. 1951, Vol. 73, p. 2450). (Ref. Lander JACS)

Barium-Nickel Oxides with Tri- and Tetravalent Nickel. J. J. Lander and L. A. Wooten (J. Amer. Chem. Soc. 1951, Vol. 73, p. 2452). (Ref. Lander et al. JACS)

The crystal Structure of NiO.3BaO, NiO.BaO, BaNiO3 and Intermediate Phases . . . J. J. Lander "Acta Cryst. (1951) 4, 148. (Ref. Lander Acta. Cryst.)

The Crystal Structure of $BaNiO_3$. Takeda et al. Acta Cryst. (1976) B32, 2464. (Ref. Takeda 1976)

The work of Lander et al. included a series of compositions ranging between $BaNiO_2$ (divalent nickel) and $BaNiO_3$ (tetravalent nickel).

The crystal structure of $BaNiO_2$ was determined by x-ray diffraction (XRD) techniques (rotation photographs, back-reflection Laue patterns and powder patterns). It is orthorhombic but the Laue pattern obtained with the radiation parallel to the $c_o$ axis was found to have six-fold symmetry. Moreover the ratio of $b_o$ to $a_o$ was close to the value of √3 indicating a pseudo-hexagonal structure.

The crystal structure of $BaNiO_3$ was determined by the powder XRD method and its pattern was readily indexed as hexagonal. Table I shows the key structural parameters of the $BaNiO_2$ and $BaNiO_3$ crystalline phases.

TABLE I

| Formula | Symmetry | $a_o$ (Å) | $b_o$ (Å) | $c_o$ (Å) | V (Å)³ | Z | y-Angle |
|---|---|---|---|---|---|---|---|
| $BaNiO_2$ | Orthorhombic | 5.73 | 9.20 | 4.73 | 249 | 4 | 90° |
| $BaNiO_2$ | Pseudo-Hexagonal | 5.42 | — | 4.73 | 125 | 2 | 63.8° |
| $BaNiO_3$ | Hexagonal | 5.629 | — | 4.811 | 132 | 2 | 60° |

Three other materials were prepared with intermediate compositions between the two end products. They reported data for the reversible sequence shown next:

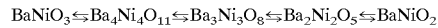

which may be also written as:

The structures of the three intermediates were not determined although they were reported to be hexagonal or nearly hexagonal similar to the symmetry of $BaNiO_3$. The sequence from left to right may be brought about by increasing the temperatures during synthesis or post treatments at constant oxygen pressure which indicates a tendency to lose oxygen by dissociation.

In the opposite direction the sequence showed oxidation of the nickel from $Ni^{2+}$ to $Ni^{3+}$ to $Ni^{4+}$ including mix-valence compounds as the synthesis temperature decreases.

Important points noted by the various authors and found out presently are:

All the intermediates exhibit hexagonal or nearly hexagonal symmetry and have almost identical hexagonal unit cells when viewed on the c direction with the barium ions in a hexagonal closed-packed arrangement like that observed in $BaNiO_3$.

The five member sequence may be represented by the formula $BaNiO_{2+y}$ ($0 \leq y \leq 1$).

The members of the sequence for example $0 \leq y < 0.9$ are precursors to $BaNiO_3$.

Single crystals of $BaNiO_2$ were easily grown in a molten $BaCl_2$ flux at about 1000° C. in nitrogen.

$BaNiO_3$ can be prepared by reacting:

A. $BaO_2$ and NiO quantitatively in an atmosphere of wet $O_2$ at 450–700° C. to form the crystal structure of $BaNiO_3$ but achieving only 98% oxidation. Beyond about 730° C. oxygen dissociation takes place.

B. $Ba(OH)_2$ with NiO in a wet atmosphere of $O_2$ at about 700° C. to form the crystal structure of $BaNiO_3$ but achieving only 90% oxidation.

Takeda et al. (1976) proceeded to react $BaCO_3$ with NiO in air at 1100° C. for 48 hours to form an intermediate that was most likely a member of the Lander et al. sequence of the general formula $BaNiO_{2+y}$. The chemical analysis of this product was not reported nor was any XRD data given. It was obviously a precursor because subsequent annealing at 600° C. in pure oxygen at an absolute pressure of 2000 bars formed the product $BaNiO_3$.

The resulting polycrystalline powder was converted into single crystals using a $Ba(OH)_2.8H_2O$ flux at 600° C. under an absolute oxygen pressure of 2000 bars. A single crystal was used to determine the highly refined crystal structure of $BaNiO_3$. A picnometer determination of its density gave 6.10 g/cm³ which corresponds to a composition of $BaNiO_{2.99}$ and a nickel valence of +3.98. The data of Lander and Takeda et al. are given in Table II.

TABLE II

X-RAY DIFFRACTION DATA OF BARIUM NICKELATE

| Authors (Date) | Lander (1951). | Takeda (1976). |
|---|---|---|
| Nature of Sample | Polycrystalline | Single Crystal |
| Symmetry | Hexagonal | Hexagonal |
| Space Group | P6$_3$/mc | P6$_3$/mmc |
| a$_0$ (Å) | 5.580 | 5.629 |
| c$_0$ (Å) | 4.832 | 4.811 |
| Calc. Density (g/cm$^3$) | 6.22 | 6.13 |
| Exper. Density (g/cm$^3$) | — | 6.10 |
| Z | 2 | 2 |
| Calc. Volume (Å)$^3$ | 130.29 | 132.02 |

The most significant findings reported by Lander and Takeda et al. on BaNiO$_3$ were:

The octahedral coordination of oxygen around nickel.

The unusual arrangement of the nickel-oxygen octahedra which are stacked in columns or chains along the c axis sharing facets as shown in FIG. 1A.

All nickel-oxygen bonds are highly covalent and the composition of each octahedron is —[NiO$_{6/2}$]— or —[NiO$_3$]—.

The nickel exhibits its highest valence (+4) or virtually so and the charge of each octahedron is −2 or virtually so.

The chains run the full length of crystallites or single crystals along the c axis. They are called polyacids by Takeda (1976). The term macroanions is preferred in the present disclosure.

The electrical charge of the macroanions or chains is neutralized by one Ba$^{2+}$ per octahedron, as shown in FIG. 1B.

Hexagonal symmetry with space group P6$_3$/mmc as shown in the unit cell representation given in FIG. 2 that gives five sections at regular intervals along the c axis.

An important feature of the structure that may be calculated from the detailed results given by Takeda et al. is the separation of the chains (5.629 Å axis to axis). Furthermore, it can be calculated that the oxygen to oxygen distance between nearest oxygen atoms from adjacent chains is too large for orbital overlap or mixing.

2.3. Related Crystal Structures

Table III in FIG. 3 shows the XRD data of barium nickelate (Takeda et al 1976). Acta Crystallogr., Sec. B. 32, 2464 (1976)); barium cobaltate (Takeda et al. JINCAO; 34, 1599; 1972), and strontium nickelate (Tagushi, H. et al., Acta Crystallogr., Sec. B, 33, 1298 (1977)). The three crystalline phases are isostructural, hexagonal, (with space group P6$_3$/mmc) showing only minor differences in their unit cell parameters.

All these crystalline phases with different transition metals and ionic cations constitute the starting parent materials from which several series of doped product can be prepared.

OBJECTS OF THE INVENTION

The overall objective of this invention is the synthesis of one-dimensional oxide superconductors based on transition metals other than copper.

It is a further object of this invention to prepare:
1. One-dimensional superconductors comprising linear, parallel, covalent chains of transition metal oxides held together by highly ionic cations. The superconductors exhibit hexagonal crystalline symmetry.
2. Polycrystalline powders, compacts and dense bodies, of object 1.
3. Single crystals from the superconductors of objects 1 or 2.
4. Polycrystalline precursors to objects 1 and 2.

It is a further object of this invention to develop methods of preparation for the materials, described in objects 1 through 4.

These and further objects of the invention will become apparent as the description of the invention proceeds.

SUMMARY OF THE INVENTION

In its broadest aspect, the new compositions of this invention are one-dimensional, ceramic oxide, crystalline superconductors comprising parallel, highly covalent chains or macroanions consisting of octahedrally coordinated oxygen around the transition metals that exhibit their highest formal valence. The chains or macroanions are held together by highly ionic, bulky cations of Group 2 (main cation) and Group 1 (doping cation) of the Periodic Table and these single valence bulky cations are capable of inducing the formation of electrical carriers (holes) within these chains or macroanions.

1. Compositions and Methods for Making.

A crystalline superconducting composition is made having the formula

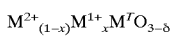
$$M^{2+}_{(1-x)}M^{1+}_{x}M^{T}O_{3-\delta} \qquad \text{Formula 3}$$

where
$M^{2+}$ is a main cation of Group 2 of the Periodic Table,
$M^{1+}$ is a doping cation of Group 1 of the Periodic Table,
$M^{T}$ is the transition metal Ni or Co,
$0.04 < x \leq 0.30$,
$0 \leq \delta \leq 0.20$, and
having hexagonal symmetry, preferably with space group P6$_3$/mmc. $M^{2+}$ is preferably Ba$^{2+}$ or Sr$^{2+}$; $M^{1+}$ is preferably K$^{1+}$, Na$^{1+}$, or Rb$^{1+}$; x is preferably $0.05 \leq x \leq 0.20$; and
$\delta$ is preferably $0 \leq \delta \leq 0.10$.

2. The Superconductor Compositions may be Prepared by Two General Methods.

2.1 A Direct Method in which:

Oxides or hydroxides of $M^{2+}$ and $M^{1+}$ are mixed together with oxides of $M^{T}$ in the desired metals proportions and heated under flowing oxygen to a temperature not to exceed about 700° C. such as for example:

2.1.1 The hydroxides of the two metals $M^{2+}$ and $M^{1+}$ are reacted with an oxide of the transition metal $M^{T}$ under an oxygen atmosphere at about 600° to 700° C.

2.1.2 The peroxides of the two metals $M^{2+}$ and $M^{1+}$ are reacted with an oxide of the transition metal $M^{T}$ under an oxygen atmosphere at temperatures ranging from about 450° C. to about 700° C.

2.1.3 Synthesis Using $M^{2+}$ Peroxides and $M^{1+}$ Superoxides.

The most desirable direct methods of preparation are those in which all the reactants possess the highest atomic oxygen to metal ratio such as $M^{T}_{2}O_{3}$, $M^{2+}O_{2}$ and $M^{1+}O_{2}$. These reactants possess more than the stoichiometric requirements of oxygen needed to oxidize the transition metal to +4 while bringing very favorable low melting points that facilitate complete reaction at low temperatures.

2.2 The Two-step Method Starts with the Preparation of a Precursor with the Composition:

$$M^{2+}_{(1-x)}M^{1+}_xM^TO_{2+y}$$  Formula 4 where $M^{2+}$, $M^{1+}$, $M^T$ and x are defined in Formula 3, and $0 \leq y \leq 0.90$.

In essence the precursors are prepared from compounds $M^{2+}$, $M^{1+}$, $M^T$ that yield the oxides such as, for example, the carbonates or mixtures of the carbonates with oxides at high temperatures in air or oxygen.

The precursors exhibit hexagonal or nearly hexagonal symmetry. They may be oxidized to the highest attainable valence of the transition metal $M^T$ to prepare the superconductor composition under very high absolute pressures of oxygen and at temperatures greater than about 500° C.

In the two step method the precursor composition of the Formula 4

$$M^{2+}_{(1-x)}M^{1+}_xM^TO_{2+y}$$

may be made by mixing compounds, other than oxides, of the three metallic reactants $M^{2+}$, $M^{1+}$, and $M^T$ in the required proportions and thermally treating the mixture in flowing air or oxygen at sufficient temperature to decompose and oxidize if necessary the compounds to obtain the oxides and react them to form the precursor compositions that often exhibit hexagonal symmetry.

3. Preparation of Single Crystals of the Superconductors.

The superconducting compositions may be prepared as single crystals from polycrystalline superconducting powders of the Formula 3 using a flux of $M^{2+}(OH)_2 \cdot 8H_2O$ and $M^{1+}OH$ at very high absolute pressures of oxygen at temperatures greater than 500° C.

4. Crystal Structure

The crystal symmetry of the superconductors is hexagonal preferably with space group $P6_3/mmc$. The symmetry of any of the materials of this class is the same as the symmetry of their parent material. However, the unit cell edges will likely be somewhat different. The difference will be small because of the relative low doping levels used to achieve electrical conductivity.

5. Electrical Conductivity

For x=0 the materials are virtually electrical insulators. For values of x greater than about 0.04 to about 0.05 the materials become conductors and in the range of x of 0.05 or higher there is a conductivity transition to hole type superconductors.

The holes travel within highly covalent, tubular-like macroanions of about 0.5 nanometers in diameter. They run parallel to the c crystal axis and because the nearest distance between adjacent macroanions is too large for orbital overlap, these crystalline products are one-dimensional superconductors.

BRIEF DESCRIPTION OF THE DRAWINGS

FIG. 1 shows two geometric illustrations. FIG. 1A displays a linear macroanion of facet-linked octahedra that runs parallel to the c axis and FIG. 1B displays the chain or macroanion with surrounding cations.

FIG. 2 is a drawing of five sections of the hexagonal crystal structure of the parent material barium nickelate viewed at uniform intervals along to the c axis. In general it is also the representation of the doped products of the instant invention when some of the main cations are replaced by doping cations.

FIG. 3 shows Table III of x-ray diffraction data (XRD) of the parent materials $BaNiO_3$ (Takeda, 1976), $BaCoO_3$ (Taguchi et al, 1977) and $SrNiO_3$ (Takeda et al 1972), that show the isostructural nature of these parent materials. Those XRD data are also representative of the crystalline symmetry of the isostructural, doped descendants.

FIG. 4 depicts four aligned XRD patterns of the materials prepared in Examples 1, 2, 3 and 4 showing them to be isostructural. The graphical data are supplemented by Table IV that provides numerical data of the strongest diffraction peaks.

DESCRIPTION OF THE PREFERRED EMBODIMENTS

1. Composition and Crystal Structure

The general compositions of the hole-type conductors or superconductors of this invention given by Formula 3 may be specifically illustrated by substituting $M^{2+}$ by $Ba^{2+}$, $M^{1+}$ by $K^{1+}$ and $M^T$ by Ni. The resulting series of materials becomes:

$$Ba_{(1-x)}K_xNiO_{3-\delta}$$  Formula 5 one each for each selected value of x and degree of oxidation.

In Formula 5 nickel most preferably exhibits its higher formal oxidation state of +4 but may exhibit a valence of +3.90±0.10. It is covalently and strongly bonded octahedrally to oxygen. The octahedra form continuous chains by sharing opposite facets with adjacent octahedra. The composition of each octahedron is $[NiO_{6/2}]$ or $[NiO_3]$. The net charge of each octahedron is -2. A continuous chain of octahedra may be called a polyacid or preferably a macroanion. The nickel is, of course, located inside of the cylindrical sheath formed by the oxygen which is on the outside. The structure of such macroanions is illustrated in FIG. 1A.

The macroanions are aligned in a parallel array and held together by the coulombic forces of the external cations. In this case by the main cation $Ba^{2+}$ and the doping cation $K^{1+}$ as depicted symbolically in FIG. 1B. The sum of the doping cation (potassium) and the main cation (barium) per formula unit is 1. The holding cations are aligned parallel to the macroanions or chains forming the overall crystal structure that exhibits hexagonal symmetry.

FIG. 2 gives five sections along the c axis of the unit cell of the parent material barium nickelate that exhibits the same symmetry as the new compositions given by formula 5 so long as the doping level is relatively low such as $0 < x \leq 0.30$.

In the sequence of compositions obtainable as a function of x, the materials will undergo electrical conductivity transitions from insulator to conductors to superconductors.

Other doping cations may be used provided that they are highly ionic, have a large ionic radius and belong to Group 1 of the Periodic Table, such as for example sodium and rubidium. Potassium is preferred because its ionic radius is very close to the ionic radius of the main cation barium. The substitution of potassium for barium causes only very minor changes in unit cell parameters, but does not change the crystal symmetry.

The oxygen level per formula unit will depend on the specific method of preparation. Optimally, it will be 3 which corresponds to a nickel valence of +4 and $\delta$ of 0, if the annealing step in oxygen is carried out at very high absolute oxygen pressures such as 2,000 bars, using high temperatures (ca. 600° C.) for long periods of time such as, for example, 48 hours. At lower oxygen pressures the material may show increased values of $\delta$.

If the value of $\delta$ is relatively high such as for example greater than 0.20 the crystal structure may begin to exhibit oxygen vacancies or become unstable and change to other crystal phases causing harmful effects. A slight deficiency of oxygen will not cause a change in crystal symmetry. However, oxygen vacancies may affect electrical conductivity and prevent the transition to superconductivity.

2. Synthesis

As described earlier in Section 1 of the Summary of the Invention, the preparation of the materials of the instant invention may be carried out using two main methods. The direct method and the two-step methods involving precursors.

2.1 The Direct Method

Oxides or hydroxides of $M^{2+}$ and $M^{1+}$ are mixed together with oxides of $M^T$ in the desired metals proportions and heated under flowing wet oxygen to a temperature not to exceed 700° C. such as for example:

2.1.1 Synthesis Using $M^{2+}$ and $M^{1+}$ Hydroxides

A direct method may use the hydroxides of $M^{2+}$ and $M^{1+}$. An illustrative example using $Ba(OH)_2$, KOH and NiO in flowing wet oxygen is shown next:

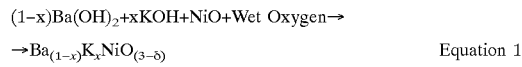

$$\rightarrow Ba_{(1-x)}K_xNiO_{(3-\delta)} \qquad \text{Equation 1}$$

Wet oxygen as used above is dry oxygen which has been bubbled through ambient temperature water. These reactants are not very difficult to handle and excel because they exhibit very low m.p. [78° C. for $Ba(OH)_2$ and 360° C. for KOH]. The difficulty with hydroxides lies in the fact that they do not intrinsically posses any oxidation power and the required oxygen must be provided by the flowing wet oxygen. After about 24 hours at a temperature up to about 600° C. under a flow of wet oxygen the flow is changed to pure dry oxygen. This method tends to fall somewhat short regarding the degree of oxidation of the transition metal. It is very difficult to reach a valence of +4 unless other means of oxidation are used such as, for example, the use of high oxygen pressure, or starting with a higher transition metal oxide like $Ni_2O_3$.

2.1.2 Synthesis Using $M^{2+}$ and $M^{1+}$ Peroxides.

The preparation involving the use of $M^{2+}$ and $M^{1+}$ peroxides is somewhat difficult to implement because the peroxides such as $BaO_2$, $SrO_2$, $K_2O_2$, $Na_2O_2$, etc. are not always fully reliable regarding stoichiometry, stability in air ($H_2O$ and $CO_2$) and purity. Thus, much care must be exercised in the selection of reactants, in their handling and in the procedures used. They require special attention, techniques and equipment. However, they posses unique properties which facilitate the preparation of the target compositions. For example the m.p. of $BaO_2$ is 450° C. while the m.p. of BaO is 1918° C. In general the m.p. difference between monoxides and peroxides applies also to the other $M^{2+}$ peroxides. The peroxides of $M^{1+}$ such as for example sodium, potassium, rubidium, etc. also exhibit relatively low m.p. In short, all the peroxides exhibit very strong oxidation power (particularly in the presence of water vapor), provide high alkalinity and posses much lower melting points than the corresponding monoxides, all of which is desirable.

The following reaction illustrates the preparation of $Ba_{(1-x)}K_xNiO_{3-\delta}$ using peroxides.

$$(1-x)BaO_2+0.5xK_2O_2+NiO+Wet\ Oxygen \rightarrow Ba_{(1-x)}K_xNiO_{3-\delta} \quad \text{Eq. 2}$$

Note that the only refractory material in the reaction is NiO with a m.p. of 1984° C. However, upon heating $BaO_2$ melts at 450° C. which provides a fluid medium together with $K_2O_2$ to rapidly mix and react with the solid NiO particles and oxidize the $Ni^{2+}$ to $Ni^{3+}$ and eventually $Ni^{4+}$ or virtually so.

The reaction mixtures that exhibit a pale green color before heating turn rapidly black when the temperature reaches about 450° C., the melting point of the peroxide $BaO_2$.

The reaction rate increases as the temperature is increased. However, it is important to apply the heat slowly and uniformly toward the target temperature and it is imperative to avoid excessive temperatures to prevent oxygen loss by dissociation. In general a temperature limit of about 700° C. should be set to prevent the loss of oxygen and the concurrent increase of the value of $\delta$.

The use of transition metal oxides with higher valence than +2, such as for example $Co_2O_3$, will provide additional oxygen from within the reactants. Finally, the use of high oxygen pressure (P) such as $1\ bar \leq P \leq 3$ bars will tend to reduce the loss of oxygen.

2.1.3 Synthesis Using $M^{2+}$ Peroxides and $M^{1+}$ Superoxides.

In this method the peroxides of the main imetals ($M^{2+}$) and the superoxides of the doping metals ($M^{1+}$) are reacted with an oxide of the transition metal $M_T$ under an atmosphere of wet oxygen at temperatures ranging from about 450° C. to about 700° C. for a period of 24 to 48 hours. The ideal reaction may be represented by Equation 3

$$(1-x)BaO_2+xKO_2+NiO+Wet\ Oxygen \rightarrow Ba_{(1-x)}K_xNiO_3 \qquad \text{Eq. 3}$$

Note that the high concentration of oxygen in the potassium superoxide provides with the other reactants the stoichiometric requirements to achieve a valence of +4 for the nickel and a value of zero for $\delta$. This is true for any doping level (x) and also for any other compositions of doped parents such as the nickelates and cobaltates in which the sources of $M^{2+}$ ($BaO_2$ and $SrO_2$) and the sources of $M^{1+}$ ($NaO_2$, $KO_2$, $RbO_2$) exhibit relatively low melting points.

Furthermore, when the $M^{2+}$ peroxides with relatively low melting points and the $M^{1+}$ superoxides also with relatively low melting are reacted with the higher oxides of $M^T$ such as $Ni_2O_3$ or $Co_2O_3$, all with melting points about half those of the corresponding monoxides, gives the best overall combination of reactants due to the highest concentration of oxygen obtainable from within the reactants and their significant lower melting points.

Equation 4 illustrates an optimal reaction:

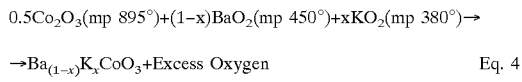

$$\rightarrow Ba_{(1-x)}K_xCoO_3+Excess\ Oxygen \qquad \text{Eq. 4}$$

Another similar reaction may use $Co_3O_4$ (mp ~900° C.).

2.1.4 Synopsis of the Direct Methods of Synthesis

In order to illustrate the importance of using high oxygen to metal ratios, coupled with low melting points, Table IV is presented followed by an explanation of the effects based on the use of compounds with the two extreme oxygen to metal ratios.

TABLE IV

| Atomic Oxygen to Metal Ratio | Transition Metal Oxides | | Group 2 Metal Oxides | | Group 1 Metal Oxides | |
|---|---|---|---|---|---|---|
| | Formula | MP-° C. | Formula | MP-° C. | Formula | MP-° C. |
| Minimum | NiO | 1984 | BaO | 1918 | $Na_2O$ | ~1132 |
| Maximum | $Ni_2O_3$ | ~600 | $BaO_2$ | 450 | $NaO_2$ | 552 |
| Minimum | CoO | 1830 | SrO | 2531 | $K_2O$ | 350 d. |
| Maximum | $Co_2O_3$ | 895 | $SrO_2$ | 215 d. | $KO_2$ | 380 |

TABLE IV-continued

| Atomic Oxygen to Metal Ratio | Transition Metal Oxides | | Group 2 Metal Oxides | | Group 1 Metal Oxides | |
|---|---|---|---|---|---|---|
| | Formula | MP-° C. | Formula | MP-° C. | Formula | MP-° C. |
| Minimum | | | | | Rb$_2$O | 350 d. |
| Maximum | | | | | RbO$_2$ | 412 |

Any combination of reactants involving the monoxides of the metals $M^T$ and $M^{2+}$ that exhibit the minimum oxygen to metal atomic ratios, will require the use of very high temperatures to achieve complete reaction because of their very high melting points.

The very high temperature will prevent the formation of the target compositions that are known to loose $O_2$ by dissociation starting at about 700° to about 800° C. unless extremely high oxygen pressures are used.

In contrast to the use of monoxides, the use of higher oxides of $M^T$ (such as $M^T_2O_3$) with peroxides of $M^{2+}$ (such as $M^{2+}O_2$) and the superoxides of the doping $M^{1+}$ (such as $M^{1+}O_2$) will be achieved at much lower temperatures such as about 500° C. to about 700° C. with the concomitant effects of providing or exceeding the stoichiometric oxygen requirement of the reactions while preventing $O_2$ loss by dissociation. A typical reaction is represented by Equation 5.

$$0.5Ni_2O_3+(1-x)BaO_2+xKO_2+Oxygen \rightarrow Ba_{(1-x)}K_xNiO_3 \quad \text{Eq. 5}$$

2.2 The Two Step Method
2.2.1 Preparation of Precursors

In principle the simplest and general method is to mix the oxides $M^TO$, $M^{2+}O$ and $M^{1+}O$ in the desired proportions and heat them in air or preferably oxygen, at temperatures greater than about 900° C. The temperature required for this step may be on occasion quite high such as, for example, greater than 1000° C. because the reaction takes place in the solid state among mainly very refractory oxides such as, for example, BaO (m.p.=1918° C.) and NiO (m.p.=1984° C.).

A more general approach is to start with compounds that are stable and can provide upon heating the desired oxide mix through thermal decomposition, oxidation, dehydration, combustion, etc. or combinations thereof. For example, dry carbonates may be mixed and thermally decomposed; the oxalates may be oxidized/decomposed to form the oxides; the hydroxides or hydroxide hydrates such as Ba(OH)$_2$.8H$_2$O, may be thermally dehydrated to make the desired mix; etc.

From a stoichiometry point of view, the use of high purity, dry carbonates of the main and doping cations and anhydrous monoxides of the transition metals provides a set of good starting materials. They are readily available in high purity form, may be easily dried without decomposition and allow for accurate weighing and safe handling. The preferred two step method of preparation involves mixing thoroughly the three mentioned metal compounds in the desired proportions. The mixed powder is then heated in air or oxygen at sufficient temperature and time to achieve decomposition of any carbonates into $CO_2$ and the corresponding metal oxides and the reaction of the oxides to form the desired crystalline precursor as shown in Formula 6.

The reaction requires very high temperature (in excess of 1000° C.) to decompose the carbonates and then to complete the solid-solid reaction between the highly refractory oxides with melting points approaching 2000° C. The presence of small amounts of Group 1 oxide tends to facilitate the reaction because of the relatively low m.p. of the $M^{1+}_2O$.

The reaction may be represented by the following equation:

$$M^TO+(1-x)M^{2+}CO_3+0.5xM^{1+}_2CO_3+\text{Flowing Air or Oxygen} \rightarrow$$
$$\rightarrow M^{2+}_{(1-x)}M^{1+}_xM^TO_{2+y}+(1-0.5x)CO_2 \quad \text{Equation 6.}$$

Specifically, to prepare the precursor $BaO_{0.90}K_{0.10}NiO_{2+y}$, Equation 6 becomes:

$$NiO+0.90BaCO_3+0.05K_2CO_3+\text{Flowing Air or Oxygen} \rightarrow$$
$$\rightarrow Ba_{0.90}K_{0.10}NiO_{2+y}+0.95CO_2 \quad \text{Equation 7.}$$

The procedure is completed after the fired materials are cooled and the precursors recovered and kept in a dry and sealed container.

The transition metal in the precursors will not remain divalent because of the oxidation brought about by air or oxygen during firing at temperatures in excess of 1000° C. The nickel valence becomes a function of y and will change to a value between +2 and +4 depending on the temperature and oxygen pressure used.

2.2.2 The Precursor Oxidation

Once the precursors $M^{2+}_{(1-x)}M^{1+}_xM^TO_{2+y}$ are obtained in powder form they may be oxidized to $M^{2+}_{(1-x)}M^{1+}_xM^TO_{3-\delta}$ using very high absolute pressures of oxygen, such as, for example, 1000 to 2000 bars, at high temperatures, such as, for example, 500° C. to 700° C., for sufficient periods of time, such as, for example, 48 hours to allow for oxygen diffusion into and throughout the crystal structure. Preferred absolute pressures of oxygen are greater than 1500 bars and preferably temperatures from 500° to 600° C. In this manner polycrystalline powders of the superconductors may be obtained from polycrystalline powders of the precursors.

The reaction may be represented by:

$$M^{2+}_{(1-x)}M^{1+}_xM^TO_{2+y}+\text{Oxygen} \rightarrow M^{2+}_{(1-x)}M^{1+}_xM^TO_{3-\delta} \quad \text{Equation 8.}$$

2.3 Preparation of Single Crystal Superconductors from Polycrystalline Powders.

Polycrystalline powders of the superconductors may be converted to single crystals through the use of an appropriate low melting flux. The flux may be prepared from Ba(OH)$_2$.8H$_2$O (m.p. of about 78° C.) or Sr(OH)$_2$.8H$_2$O (m.p. of about 100° C.) and the corresponding hydroxide of the dopant of Group 1 from the Periodic Table such as NaOH (m.p. about 318° C.), KOH (m.p. about 360° C.), RbOH (m.p. about 301° C.), etc. Both the superconductive polycrystalline powder and the binary flux are placed within a tubular crystallizer made of an inert material such as, for example, gold. The binary mix of hydroxides will loose some water as they begin to melt and are heated above about 500° C. The resulting flux must comprise $M^{2+}$ and $M^{1+}$ in the right proportions (to achieve equilibrium of the cations between the solid and the flux). The flux will be used in the range of 600°±100° C., under absolute oxygen pressures of about 1000 to 2000 bars for periods of 24 to 48 hours. The formation of single crystals is facilitated by the use of a thermal gradient or temperature differential, for example, 5° C. or larger per cm along the length of the tubular crystallizer.

The following factors should be taken into account for a successful execution:

The ingredients of the flux must not react chemically with the powder product, but should dissolve it in very small amounts to readily reach saturation.

The solubility of the powder while very small should increase with temperature.

Preferably a tubular, inert crystallizer or capsule should be used for the conversion of polycrystalline powders to single crystals.

The mixed solid ingredients of the flux should be placed along the capsule length. The polycrystalline superconductor should be placed at one of the ends. A pressurized oxygen atmosphere should be established above the solids before starting heating.

Gradual heating should begin and the temperature slowly increased until complete melting of the flux ingredients takes place. Some time should be allowed to equilibrate the system.

Preferably a thermal gradient along the length of the capsule should be created and maintained such as, for example, 10° C. per cm to obtain large crystals of the order of abut 1 mm in diameter and about 4 mm in length.

After sufficient time the system should be quenched and the single crystals separated from the flux and recovered.

3. Characterization.

4. Chemical analyses and Powder X-ray diffraction are essential determinations to confirm the composition and crystal structure of the desired products (precursors and superconductors). In some cases the transition metal valence should be determined by titration as shown in Examples 11 to 16. However, for superconductors the most important determinations are those relating to superconductivity.

4.1 Resistivity and Critical Temperature.

The determination of electrical resistivity may be carried out with pressed polycrystalline compacts or single crystals by any of several well known methods such as, for example, the four-point probe method or the two-point probe method. Both of these methods are described in Section 20, page 4 of the second edition of "The Handbook of Semiconductor Electronics" by Lloyd P. Hunter published by McGraw Hill in 1962. For example, in the case of the four point probe, the measuring probe and the sample may be located inside of a container capable of being cooled by an appropriate coolant such as liquid nitrogen or liquid helium to extremely low temperatures. The temperature of the system may be measured by means of a thermocouple or thermistor located next to the sample. A series of resistance measurements can be made as the temperature is decreased or heated. The plot of resistivity versus temperature of a superconductive material will reveal a sharp decrease in resistivity down to zero as the temperature reaches the critical temperature. It will remain at that level at all temperatures below $T_c$. The break in resistivity versus temperature plot may be observed on heating as well as on cooling procedures. Pure superconductive crystalline phases will show a very sharp break in the plot, while mixtures of superconductors and other materials will show gradual breaks in the plot.

4.2 The Meissner Effect.

The Meissner Effect is based on the property of a pure superconductor to be a perfect diamagnet. Thus when a superconductor reaches the critical temperature all magnetic flux (lines of force) will be excluded from the superconductor. This property may be established by making magnetization (magnetic susceptibility) measurements on a known weight of material in a known magnetic field. The determinations should be made, as in the case of the resistivity as a function of temperature on a cooling and a heating succession. In this manner the data will confirm the value of the critical temperature obtained from resistivity determinations and also provide the fraction of the superconducting phase within the sample.

The determination of the Meissner effect may be done following the method described in the 2nd. Edition of "Superconductivity" by D. Shoenberg in pages 18–19 published by Cambridge University Press. New York (1965).

Having described the basic aspects of the invention, the following examples are given to illustrate specific embodiments thereof.

EXAMPLES 1 (REFERENCE), 2, 3 AND 4

The series of four examples that follows was carried out to obtain important information on the preparation and properties of three precursors comprising nickel oxide, barium oxide and different levels of potassium oxide as represented by $Ba_{(1-x)}K_xNiO_{2+y}$.

The first example was $BaNiO_{2+y}$. It contained no potassium, thus x=0 and virtually corresponds to the Takeda (1976) precursor. It provides the reference base line for the three potassium doped materials that exhibited compositions of:

Example 2 $Ba_{0.95}K_{0.05}NiO_{2+y}$ (x=0.05),
Example 3 $Ba_{0.90}K_{0.10}NiO_{2+y}$ (x=0.10) and
Example 4 $Ba_{0.85}K_{0.15}NiO_{2+y}$ (x=0.15).

They were prepared using the Aldrich Chemicals of high purity listed next:

| Chemical | Designation | % Purity: |
|---|---|---|
| NiO | (20,388-2) | 99.99 |
| $BaCO_3$ | (32,943-6) | 99.98 |
| $K_2CO_3$ | (46,781-2) | 99.99 |

These chemicals were mixed in the following proportions.

EXAMPLE 1 (x=0)

1.3990 g (18.73 mmol) of NiO were thoroughly mixed with 3.6965 g (18.73 mmol) of $BaCO_3$ and charged to a crucible.

EXAMPLE 2 (x=0.05)

1.4938 g (20.00 mmol) of NiO were thoroughly mixed with 3.7496 g (19.00 mmol) of $BaCO_3$, and 0.0691 g (0.50 mmol) of $K_2CO_3$, and charged to a crucible.

EXAMPLE 3 (x=0.10)

1.4938 g (20.00 mmol) of NiO were thoroughly mixed with 3.5523 g (18.00 mmol) of $BaCO_3$, and 0.1382 g (1.00 mmol) of $K_2CO_3$, and charged to a crucible.

EXAMPLE 4 (x=0.15)

1.4938 g (20.00 mmol) of NiO were thoroughly mixed with 3.3549 g (17.00 mmol) of $BaCO_3$, and 0.2073 g (1.50 mmol) of $K_2CO_3$, and charged to a crucible.

All the powder mixtures had a pale green color. They were heated in air at 1066° C. for 48 hours, cooled, ground to a fine powder and placed in glass vials for safe keeping and later use. After heating all the materials were black.

The products were then examined by the powder X-ray diffraction method, in the (2θ) range of 10° to 100°, using copper Kα radiation. The angular scanning rate used was 50 determinations of absolute intensities in counts per second (PCS) per degree. The resulting patterns gave the absolute intensities (CPS) for every diffraction angle (2θ) in the range of 10° to 100°. The four XRD patterns obtained are shown graphically in FIG. 4. They are aligned vertically using a common (2θ) abcissa in FIG. 4 to facilitate direct visual comparisons. The graphical aligned XRD patterns of FIG. 4 is supplemented with Table V that gives the d-spacings and absolute intensities of the eight strongest peaks. The d-spacings were calculated from the corresponding 2θ values using Bragg's equation.

TABLE V

COMPARISON OF MAJOR XRD PEAKS OF FOUR PATTERNS

| Example 1 | | Example 2 | | Example 3 | | Example 4 | |
|---|---|---|---|---|---|---|---|
| d (Å) | CPS | d (Å) | CPS | d (Å) | CPS | d (Å) | CPS |
| 3.258 | 213 | 3.268 | 296 | 3.260 | 296 | 3.275 | 234 |
| 2.844 | 686 | 2.857 | 1246 | 2.848 | 864 | 2.853 | 650 |
| 2.403 | 660 | 2.413 | 756 | 2.411 | 1892 | 2.413 | 2294 |
| 2.162 | 207 | 2.170 | 253 | 2.169 | 225 | 2.153 | 262 |
| 2.084 | 1246 | 2.089 | 1459 | 2.088 | 4502 | 2.089 | 5461 |
| 1.476 | 853 | 1.478 | 795 | 1.478 | 1998 | 1.478 | 2632 |
| 1.259 | 441 | 1.260 | 396 | 1.257 | 655 | 1.257 | 784 |
| 1.206 | 339 | 1.207 | 310 | 1.207 | 812 | 1.207 | 949 |

The data of the strongest diffraction peaks are shown in bold. Note the significant increase of intensity from Example 1 through Example 4 (1246 to 5461 CPS).

The following observations were made and conclusions drawn from these four experiments:

- The substitution of barium by potassium has only a minimal crystalline structural effect. The XRD patterns of the potassium doped materials are virtually identical to the XRD pattern of the undoped Example 1 material, regarding the 2θ location of the peaks or the corresponding d-spacings.
- The presence of potassium increases the interatomic distances in the structure in an extremely small degree.
- The four materials are isostructural. The same conclusion is likely valid for other low levels of potassium doping in other crystalline Ni—Ba—K—O phases.
- The degree of crystallinity observed in the undoped material after heating at 1066° C. for 48 hours is much lower than the corresponding degree in the doped products. Note the intensities of the strongest peak in each pattern that are 1246, 1459, 4502 and 5461 CPS as the potassium fraction (x) increases from 0 to 0.05, 0.10 and 0.15 respectively. In contrast to the minimal effect, if any, in peak position, the presence of potassium brings about major increases in intensity.
- It is apparent that the non-refractory $K_2O$ greatly affects the degree of crystallization that increases by a factor of over 4 in the range studied. This is an important finding because other alkali metal oxides will likely have the same effect in similar compositions.
- None of the four XRD patterns could be indexed as $BaNiO_2$ or $BaNiO_3$ which are the well known crystalline phases published by Lander and Lander and Wooten in 1951. The XRD patterns correspond to precursor compositions given by the formula $Ba_{(1-x)}K_xNiO_{2+y}$. In this respect they parallel the oxidation-reduction sequence

given in the "Description of the Previously Published Art" in Section 2.2 for the BaO—NiO system.

EXAMPLE 5

The precursor $Ba_{0.90}K_{0.10}NiO_{2+y}$ prepared in Example 3 is heated at 900° C. under flowing nitrogen with a trace of oxygen for 24 hours. The resulting material is quenched to ambient temperature. A small amount of the crystalline product is examined by x-ray diffraction and indexed. It is found to exhibit orthorhombic symmetry and is isostructural with $BaNiO_2$ as identified in Table I. The balance of the material is placed and kept sealed for future use.

EXAMPLE 6

Example 5 is repeated in every respect except that flowing wet oxygen is used during the heating step The resulting crystalline product is not crystallographically isostructural with $Ba_{0.90}K_{0.10}NiO_2$, but corresponds to an intermediate $Ba_{0.90}K_{0.10}NiO_{2+y}$ in which y is larger than in Example 5 because of extra oxygen.

EXAMPLE 7 (REFERENCE)

The polycrystalline $BaNiO_{2+y}$ precursor prepared in Example 1 is annealed at 600° C. under an oxygen pressure of 2000 bars for a period of 48 hours to achieve oxidation of the nickel to +4 through the increase of oxygen contents. The recovered product exhibits a hexagonal powder XRD which corresponds to $BaNiO_3$ as reported by Takeda et al. (1976). The unit cell edges are about $a_0$=5.63 Å and $c_0$=4.81 Å.

EXAMPLE 8

The polycrystalline $Ba_{0.90}K_{0.10}NiO_{2+y}$ precursor prepared in Examples 3, is annealed at 600° C. under a high oxygen pressure of 2000 bars for a period of 48 hours to achieve oxidation of the nickel to virtually +4 through the increase of oxygen contents. The recovered products exhibits a hexagonal powder XRD pattern that shows the product to be isostructural with $BaNiO_3$ prepared in Example 7 with unit cell edges of about $a_0$=5.6 Å and about $c_0$=4.8 Å. The product corresponds crystallographically to polycrystalline $Ba_{0.90}K_{0.10}NiO_{3-\delta}$.

EXAMPLE 9

A mixture of $Ba(OH)_2.8H_2O$, KOH and the polycrystalline powder prepared in Example 7 with a composition of $Ba_{0.90}K_{0.10}NiO_{3-\delta}$ is placed in a gold cylindrical tube or capsule with an open end. The mixture exhibits the following approximate molar proportions: $7Ba(OH)_2.8H_2O$ to 3KOH to $3Ba_{0.90}K_{0.10}NiO_{3-\delta}$. The capsule and its contents is flushed with pure oxygen until free of other gas, pressurized to about 1000 bars with oxygen and heated to about 400° C. From this point on the temperature and oxygen pressure are increased gradually to 600° C. and 2000 bars. These conditions are maintained for 48 hours. Then while maintaining the oxygen pressure the capsule and its contents are cooled to room temperature and then depressurized. The contents are washed with water which dissolves the $Ba(OH)_2.8H_2O$ and KOH, but does not dissolve the resulting small single crystals of barium potassium nickelate.

EXAMPLE 10

Large single crystals of about 1 mm in diameter and about 4 mm in length grow at the cooler end of the capsule when Example 9 is repeated imposing a thermal gradient of 10° C. per cm along the length of the gold tube or capsule.

EXAMPLE 11

Polycrystalline $Ba_{0.90}K_{0.10}NiO_{3-\delta}$ is prepared by reacting 100 mmoles of NiO with a mixture of 90 mmoles of $BaO_2$ and 5 mmoles of $K_2O_2$ at 600° C. under flowing wet oxygen at a pressure of 1 bar for a period of 48 hours. The reaction mixture has a light green color that becomes black starting at about 430° C. indicating the beginning of nickel oxidation. The final product is black. The nickel valence is determined by quantitatively dissolving a known weight of the final black product in dilute hydrochloric acid containing potassium iodide and titrating the liberated iodine with a solution of sodium thiosulfate of known assay. The nickel valence falls in the range of 3.95±0.04.

EXAMPLE 12

Example 11 is repeated in every respect except that the reaction temperature is increased to 700° C., the flowing wet oxygen pressure is increased to 2 bars and the reaction time is reduced to a period of 24 hours. The nickel valence falls in the range of 3.94±0.04.

EXAMPLE 13

Polycrystalline $Sr_{0.90}Na_{0.10}CoO_{3-\delta}$ is prepared by reacting 50 millimoles of $Co_2O_3$ with a mixture of 90 mmoles of $SrO_2$ and 5 mmoles of $Na_2O_2$ at 600° C. under flowing wet oxygen at a pressure of 2 bars for a period of 48 hours. The reaction mixture has a gray color that becomes darker starting at about 350° C. indicating the beginning of additional cobalt oxidation. The final product is black. The product exhibits hexagonal symmetry. The cobalt valence is determined by dissolving a known weight of the final black product in dilute hydrochloric acid containing potassium iodide and titrating the liberated iodine with a solution of sodium thiosulfate of known assay. The cobalt valence falls in the range of 3.96±0.04.

EXAMPLE 14

Polycrystalline $Ba_{0.85}K_{0.15}NiO_{3-\delta}$ is prepared by reacting 100 millimoles of NiO with a mixture of 85 mmoles of $Ba(OH)_2$ and 15 mmoles of KOH at 600° C. under flowing wet oxygen at a pressure of 2 bars for a period of 48 hours. The initial light green color turns to black at about 430° C. After the first heating phase the water in the flowing gas is eliminated and the reaction is allowed to continue for another 24 hours. The final product is black. The product exhibits hexagonal symmetry. The nickel valence is determined by quantitatively dissolving a known weight of the final black product in dilute hydrochloric acid containing potassium iodide and titrating the liberated iodine with a solution of sodium thiosulfate of known assay. The nickel valence falls in the range of 3.90±0.05.

EXAMPLE 15

Polycrystalline $Ba_{0.90}K_{0.10}NiO_{3-\delta}$ is prepared by reacting 50 millimoles of $Ni_2O_3$ with a mixture of 90 mmoles of $BaO_2$ and 10 mmoles of $KO_2$ at 600° C. under flowing wet oxygen at atmospheric pressure for a period of 48 hours. The reaction mixture has a gray color that becomes black starting at about 430° C. indicating the beginning of additional nickel oxidation. The final product is black. The nickel valence is determined by dissolving a known weight of the final black product in dilute hydrochloric acid containing potassium iodide and titrating the liberated iodine with a solution of sodium thiosulfate of known assay. The cobalt valence falls in the range of 3.96±0.04.

EXAMPLE 16

Polycrystalline $Sr_{0.90}Na_{0.10}CoO_{3-\delta}$ is prepared by reacting 20 millimoles of $Co_3O_4$ with a mixture of 54 mmoles of $SrO_2$ and 6 mmoles of $NaO_2$ at 600° C. under flowing wet oxygen at atmospheric pressure for a period of 48 hours. The reaction mixture has a light gray color that becomes darker starting at about 430° C. indicating the beginning of additional cobalt oxidation. The final product is black and exhibits hexagonal symmetry. The cobalt valence is determined by dissolving a known weight of the final black product in dilute hydrochloric acid containing potassium iodide and titrating the liberated iodine with a solution of sodium thiosulfate of known assay. The cobalt valence falls in the range of 3.95±0.04.

It is understood that the foregoing detailed descriptions are given merely by way of illustration and that many variations may be made therein without departing from the spirit of this invention.

What is claimed is:

1. A crystalline composition having the formula $$M^{2+}_{(1-x)}M^{1+}_xM^TO_{3-\delta}$$

where $M^{2+}$ is a cation of Group 2 of the Periodic Table, $M^{1+}$ is a cation of Group 1 of the Periodic Table, $M^T$ is the transition metal Ni or Co, $0.04 < x \leq 0.30$, $0 \leq \delta \leq 0.20$, and having hexagonal symmetry.

2. A composition according to claim 1, wherein $0 \leq \delta \leq 0.10$.

3. A composition according to claim 1, wherein the hexagonal symmetry possesses space group $P6_3/mmc$.

4. A composition according to claim 1, wherein $M^{2+}$ is $Ba^{2+}$ or $Sr^{2+}$.

5. A composition according to claim 1, wherein $M^{1+}$ is $Na^{1+}$, $K^{1+}$, or $Rb^{1+}$.

6. A composition according to claim 1, wherein $0.05 < x \leq 0.20$.

7. A composition according to claim 1, wherein the crystalline material is a single crystal.

8. A composition according to claim 7, wherein the single crystal is larger than about 1 mm in diameter and about 4 mm in length.

9. A method of making a composition of the formula $$M^{2+}_{(1-x)}M^{1+}_xM^TO_{3-\delta}$$

according to claim 1, comprising heating metal oxides of $M^{1+}$ and $M^T$ with the peroxides of $M^{2+}$ in the required proportions under oxygen at temperatures ranging from about 450° C. to about 700° C.

10. A method according to claim 9, wherein the metal oxides of $M^{1+}$ and $M^T$ are higher oxides than $M^{1+}_2O$ and $M^TO$.

11. A method according to claim 9, wherein the reaction takes place at an absolute pressure of oxygen of about 2 barsf±1 bar.

12. A method of making a composition of the formula $$M^{2+}_{(1-x)}M^{1+}_xM^TO_{3-\delta}$$

according to claim 1, comprising oxidizing a composition having the formula $M^{2+}_{(1-x)}M^{1+}_xM^TO_{2+y}$ under an absolute pressure of oxygen greater than 1000 bars and at a temperature of at least 500° C.

13. A method of making single crystals of the formula $$M^{2+}_{(1-x)}M^{1+}_xM^TO_{3-\delta}$$

according to claim 1, comprising placing a polycrystalline powder of $M^{2+}_{(1-x)}M^{1+}_xM^TO_{2+y}$ where $0 \leq y < 0.90$ next to a mixture of $M^{2+}(OH)_2 \cdot 8H_2O$ and $M^{1+}OH$ and heating the mixture to a temperature above about 450° C. to create a flux with a molar proportion which is in equilibrium at said temperature with said solid powder and at an absolute pressure of $O_2$ of greater than 500 bars for sufficient time to form single crystals of $M^{2+}_{(1-x)}M^{1+}_xM^TO_{3-\delta}$.

14. The method of claim 13, wherein the absolute pressure of $O_2$ is greater than 500 bars.

15. The method of claim 13, wherein a temperature gradient of at least 5° C. per cm is maintained within the flux in contact with the polycrystalline powder.

16. A crystalline composition having the formula $$M^{2+}_{(1-x)}M^{1+}_xM^TO_{3-\delta}$$

where
 $M^{2+}$ is $Ba^{2+}$ or $Sr^{2+}$,
 $M^{1+}$ is $Na^{1+}$, $K^{1+}$, or $Rb^{1+}$,
 $M^T$ is the transition metal Ni or Co,
 $0.04 < x \leq 0.30$,
 $0 \leq \delta \leq 0.20$, and
 having hexagonal symmetry.

17. A composition according to claim 16, wherein $0 \leq \delta \leq 0.10$.

18. A composition according to claim 16, wherein the hexagonal symmetry possesses space group $P6_3/mmc$.

19. A composition according to claim 16, wherein $0.05 < x \leq 0.20$.

20. A composition according to claim 16, wherein the crystalline material is a single crystal.

21. A composition according to claim 20, wherein the single crystal is larger than about 1 mm in diameter and about 4 mm in length.

* * * * *